United States Patent
Chen et al.

(10) Patent No.: US 10,714,389 B2
(45) Date of Patent: Jul. 14, 2020

(54) STRUCTURE AND METHOD USING METAL SPACER FOR INSERTION OF VARIABLE WIDE LINE IMPLANTATION IN SADP/SAQP INTEGRATION

(71) Applicant: ELPIS TECHNOLOGIES INC., Ottawa (CA)

(72) Inventors: Hsueh-Chung Chen, Cohoes, NY (US); James Kelly, Schenectady, NY (US); Yann Mignot, Slingerlands, NY (US); Cornelius Brown Peethala, Slingerlands, NY (US); Lawrence A. Clevenger, Saratoga Springs, NY (US)

(73) Assignee: ELPIS TECHNOLOGIES, INC., Ottawa (CA)

( * ) Notice: Subject to any disclaimer, the term of this patent is extended or adjusted under 35 U.S.C. 154(b) by 0 days.

(21) Appl. No.: 16/239,981

(22) Filed: Jan. 4, 2019

(65) Prior Publication Data
US 2019/0206719 A1    Jul. 4, 2019

Related U.S. Application Data

(62) Division of application No. 15/860,166, filed on Jan. 2, 2018, now Pat. No. 10,276,434.

(51) Int. Cl.
*H01L 21/768*    (2006.01)
*H01L 23/528*    (2006.01)

(52) U.S. Cl.
CPC .... *H01L 21/7688* (2013.01); *H01L 21/76885* (2013.01); *H01L 23/528* (2013.01); *H01L 23/5283* (2013.01)

(58) Field of Classification Search
None
See application file for complete search history.

(56) References Cited

U.S. PATENT DOCUMENTS

| | | | |
|---|---|---|---|
| 6,352,917 B1 | 3/2002 | Gupta et al. | |
| 6,689,283 B2 | 2/2004 | Hattori et al. | |
| 7,709,396 B2 | 5/2010 | Bencher et al. | |
| 8,679,981 B1 | 3/2014 | Weling et al. | |
| 8,782,586 B2 | 7/2014 | Sezginer et al. | |
| 9,070,448 B2 | 6/2015 | Min et al. | |
| 9,117,654 B2 | 8/2015 | Lee et al. | |
| 9,437,481 B2 | 9/2016 | Yuan et al. | |

(Continued)

OTHER PUBLICATIONS

M. Tagami et al., "56nm-Pitch Low-k/Cu Dual-Damascene Interconnects Integration with Multiple Exposure Patterning Scheme," AMC, 2012, 2 pages.

(Continued)

*Primary Examiner* — Herve-Louis Y Assouman
(74) *Attorney, Agent, or Firm* — Borden Ladner Gervais LLP; Shin Hung

(57) ABSTRACT

Semiconductor devices and methods to fabricate the devices are provided. For example, a semiconductor device includes a back-end-of-line (BEOL) structure formed on a semiconductor substrate. The BEOL structure further includes at least one metallization layer comprising a pattern of elongated parallel metal lines. The pattern of elongated metal lines comprises a plurality of metal lines having a minimum width and at least one wider metal line having a width which is greater than the minimum width.

20 Claims, 3 Drawing Sheets

(56) References Cited

U.S. PATENT DOCUMENTS

| | | | |
|---|---|---|---|
| 2007/0238308 A1 | 10/2007 | Niroomand et al. | |
| 2007/0249174 A1 | 10/2007 | Yang | |
| 2008/0220600 A1 | 9/2008 | Alapati et al. | |
| 2009/0311861 A1* | 12/2009 | Park | H01L 21/0337 438/689 |
| 2010/0136784 A1 | 6/2010 | Mebarki et al. | |
| 2010/0297850 A1 | 11/2010 | Kim et al. | |
| 2013/0264622 A1 | 10/2013 | Lin et al. | |
| 2014/0017898 A1 | 1/2014 | Nemani et al. | |
| 2014/0273441 A1 | 1/2014 | Kim et al. | |
| 2014/0273496 A1 | 9/2014 | Kao et al. | |
| 2014/0339629 A1 | 11/2014 | Xie et al. | |
| 2015/0064912 A1 | 3/2015 | Jang et al. | |
| 2015/0147882 A1* | 5/2015 | Yao | H01L 21/76879 438/675 |
| 2016/0314985 A1 | 10/2016 | Yang et al. | |
| 2018/0233404 A1 | 8/2018 | Shu et al. | |

OTHER PUBLICATIONS

S.-T. Chen et al., "48nm Pitch Cu Dual-Damascene Interconnects Using Self Aligned Double Patterning Scheme," Proceedings of the IEEE International Interconnect Technology Conference (IITC), 2013, 3 pages.

J. Kelly et al., "Experimental Study of Nanoscale Co Damascene BEOL Interconnect Structures," Proceedings of the IEEE International Interconnect Technology Conference (IITC), 2016, pp. 40-42.

U.S. Appl. No. 15/859,675 filed in the name of Albert Chu et al. on Jan. 1, 2018 and entitled "Multi-Patterning Techniques for Fabricating an Array of Metal Lines with Difference Widths.".

Ioannis Karageorgos et al., "Impact of Interconnect Multiple-Patterning Variability on SRAMs", Proceedings of the Design, Automation & Test in Europe Conference & Exhibition, 2015, pp. 609-612.

Minoo Mirsaeedi et al., "Self-Aligned Double Patterning (SADP) Layout Decomposition", 12th Int'l Sym. on Quality Electronic Design, 2011, pp. 103-109.

ITRS (International Technology Roadmap for Semiconductors) 2011, 20 pages.

List of IBM Patents or Patent Applications Treated as Related.

* cited by examiner

100

100

STRUCTURE AND METHOD USING METAL SPACER FOR INSERTION OF VARIABLE WIDE LINE IMPLANTATION IN SADP/SAQP INTEGRATION

BACKGROUND

The present application generally relates to semiconductor fabrication techniques and, more specifically, to self-aligned patterning methods for use in fabricating semiconductor integrated circuits.

Various types of multi-patterning photolithography techniques can be utilized to manufacture semiconductor integrated circuits. Such multi-patterning techniques include sidewall image transfer (SIT), self-aligned double patterning (SADP), and self-aligned quadruple patterning (SAQP) techniques, for example. The current SIT, SADP and SAQP methods utilize deposition and etch back processes to create uniform memorization and transfer elements. In particular, these techniques involve spacer patterning steps in which spacers are formed on the sidewalls of sacrificial features (e.g., sacrificial mandrels), wherein the sacrificial features are removed to leave a pattern of spacers which is used to etch features into an underlying layer at sub-lithographic dimensions. One type of SADP method, referred to as spacer-is-dielectric (SID), utilizes the spacers (not sacrificial mandrels) to define dielectric spaces between target features (e.g., metal lines), which is in contrast to other SADP methods in which the spacers define the conductive features (metallization) which requires an extra cut mask to cut the spacers which wrap around end portions of the mandrels to avoid forming conductive loops.

SID SADP techniques are commonly utilized in back-end-of-line (BEOL) process flows for fabricating a metallization level comprising an array of parallel metal lines with uniform widths (e.g., minimum width—1×) and spacing. However, in some metallization levels, wider wires (e.g., greater than 1×) are desired to implement power rails, clock nets, analog wires, etc. The insertion of wider wires (greater than minimum width 1×) can be supported in SADP with severe limitations. For example, in a SID SADP process flow, the spacer width is fixed, while mandrel and non-mandrel widths can be modulated to pattern wider wires. However, the insertion of wide wires in an array of uniform wide wires is limited to a pair of wide wires to align the mandrel/non-mandrel assignment. Furthermore, wider mandrel shapes also present a challenge to the lithography fidelity of adjacent 1×-width features.

SUMMARY

Embodiments described herein provide methods of forming semiconductor devices.

For example, one exemplary embodiment includes a method for fabricating a semiconductor device. The method comprises forming metal spacers on sidewalls of a pattern of elongated sacrificial structures on a substrate. The metal spacers are formed of a first metallic material. The method further comprises removing the elongated sacrificial structures while leaving the metal spacers on the substrate to form a pattern of elongated metal lines on the substrate; wherein each of the elongated metal lines have a minimum width. The method further comprises depositing a first insulating layer on the substrate and the elongated metal spacers. The method further comprises patterning the first insulating layer to form at least one opening in the first insulating layer which exposes a space between two adjacent elongated metal lines. The method further comprises filling the space between the two adjacent elongated metal lines with a second metallic material to form a metal line having a width greater than the minimum width of each of the elongated metal lines. The method further comprises removing the insulating layer.

Another exemplary embodiment includes a semiconductor device. The semiconductor device comprises a back-end-of-line (BEOL) structure formed on a semiconductor substrate. The BEOL structure comprises at least one metallization layer comprising a pattern of elongated parallel metal lines. The pattern of elongated metal lines comprises a plurality of metal lines having a minimum width and at least one wider metal line having a width which is greater than the minimum width.

These and other features, objects and advantages of the present invention will become apparent from the following detailed description of illustrative embodiments thereof, which is to be read in connection with the accompanying drawings.

DETAILED DESCRIPTION

Figure 1A:
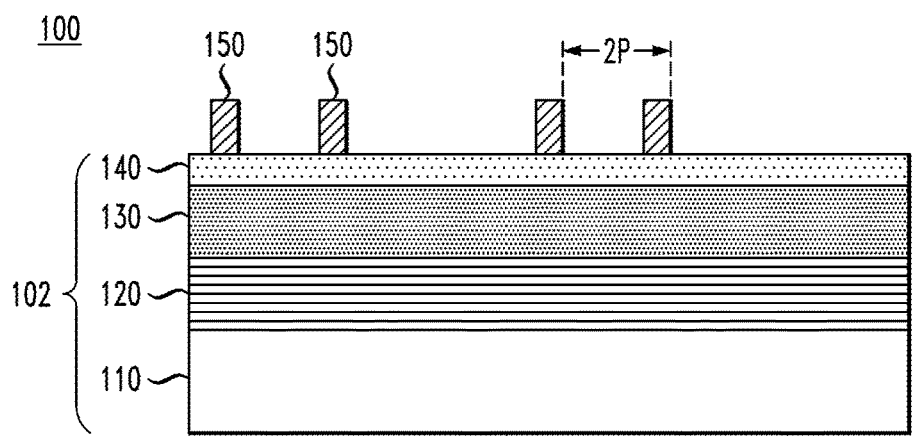
FIG. 1A is a cross-sectional view of a portion of a semiconductor device at a first-intermediate fabrication stage, according to an embodiment of the invention.

Embodiments of the invention will now be described in further detail with regard to multi-patterning methods for use in fabricating an array of metal lines comprising metal lines with different widths. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Self-aligned double patterning (SADP) and self-aligned quadruple patterning (SAQP) methods allow for tight line/space array. However, for back end of the line (BEOL) logic, pillar and via shapes should be inserted to create line-ends and via connections to prior-level metal wirings. Depending on the metal pitch, the placement of these shapes can be challenging due to overlay, as well as line-end pull-back of the pillar and via-bar shapes. The present disclosure allows for a significant relief for the placement of the pillar and via shapes. For example, the present disclosure uses mandrels to relax the placement criteria by approximately 3 times (3×) or greater or by approximately 5 times (5×) or greater. As will be further described below, the self-aligned double patterning (SADP) and self-aligned quadruple patterning (SAQP) methods of the present disclosure may have a mandrel in place once the final sidewall spacers are created. In accordance with the present disclosure, one can take advantage of this to keep the via and pillar placement at basically 3× the conventional process window or 5× the conventional process window.

FIG. 1A is a cross-sectional side view of a semiconductor structure according to an embodiment of the present invention. The semiconductor integrated circuit device 100 comprises a base 102 which can include, for example, a semiconductor substrate 110 (e.g., semiconductor wafer), a FEOL (front-end-of-line)/MOL (middle-of-line) structure 120 formed on the semiconductor substrate 110, an insulating layer 130, a hardmask layer 140, and a pattern of sacrificial mandrels 150 formed on the hardmask layer 140.

While the semiconductor substrate 110 is illustrated as a generic substrate layer, it is to be understood that the semiconductor substrate 110 may comprise one of different types of semiconductor substrate structures and materials. For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, vertical FET devices, planar MOSFET devices, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

A BEOL structure is formed on the FEOL/MOL structure to connect the various integrated circuit components of the FEOL layer. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIG. 1A, the insulating layer 130 may be an insulating layer which is formed as part of a MOL layer (e.g., pre-metal dielectric layer) or an interlevel dielectric layer (ILD layer) that is part of an interconnect level of a BEOL layer. For purposes of illustration, it is assumed that the insulating layer 130 comprises an ILD layer of the BEOL layer which is to be patterned using multi-patterning methods as discussed herein to form a metallization layer. As an ILD layer, the insulating layer 130 can be formed using any suitable dielectric material including, but not limited to, silicon oxide (e.g. SiO2), SiN (e.g., (Si3N4), hydrogenated silicon carbon oxide (SiCOH), silicon-based low-k dielectrics, porous dielectrics, or other known ULK (ultra-low-k) dielectric materials. The insulating layer 130 can be deposited using known deposition techniques, such as, for example, ALD (atomic layer deposition), CVD (chemical vapor deposition) PECVD (plasma-enhanced CVD), or PVD (physical vapor deposition). The thickness of the insulating layer 130 will define a thickness of the metal lines that are to be formed in the insulating layer 130, which will vary depending on the application (e.g., the insulating layer 130 can have a thickness in a range of 30 nm to about 200 nm).

The hardmask layer 140 is formed on the insulating layer 130 using known deposition techniques. In one embodiment, the hardmask layer 140 is formed of a material that has etch selectivity with respect to the materials of the insulating layer 130 and the sacrificial material that forms the array of sacrificial mandrels 150. For example, the hardmask layer 140 can be formed of a nitride material such as TiN or SiN, etc.

As shown in FIG. 1A, the sacrificial mandrel features 150 comprise elongated features which are spaced apart by pitch P and which have a width W. In one embodiment, the pitch P is about 64 nm or less, and the width is in a range of about 10 nm to about 32 nm. Furthermore, the sacrificial mandrel features 150 have a height H which is in a range of about 20 nm to about 100 nm.

The array of sacrificial mandrels 150 can be formed using known methods. For example, a layer of sacrificial insulating/dielectric material is deposited on the hardmask layer 140 and then patterned using known techniques to form the array of sacrificial mandrels 150. The layer of sacrificial insulating/dielectric material (which forms the sacrificial mandrels 150) may comprise any suitable material that has etch selectivity with respect to the material of the hardmask layer 140. For example, the sacrificial mandrels 150 can be formed of an oxide material when the hardmask layer 140 is formed of a nitride material. Alternatively, the sacrificial mandrels 150 can be formed of a photo resist, an optical planarization layer (OPL), an amorphous silicon material, an amorphous carbon material or a nitride material such as silicon nitride or titanium nitride.

The layer of sacrificial insulating/dielectric material can be patterned using e-beam lithography, optical lithography, nanoimprint lithography, directed self-assembly of block copolymers, or a combination thereof, and related etch techniques. For example, the layer of sacrificial insulating/dielectric material can be etched using a photolithography process wherein, for example, a layer of "negative" photoresist material is deposited and patterned using a bright-field mask to form a photoresist mask which defines an image of the array of sacrificial mandrels 150. The array of sacrificial mandrels 150 is formed by transferring the image of the photoresist mask into the layer of sacrificial insulating/dielectric material using a suitable etch process. The etch process may be a dry plasma etch process (e.g., RIE (reactive ion etch)) having an etch chemistry that is suitable to etch the material of the sacrificial insulating/dielectric layer selective to the underlying hardmask layer 140. In this regard, the hardmask layer 140 serves as an etch stop for the etch process.

Figure 1B:
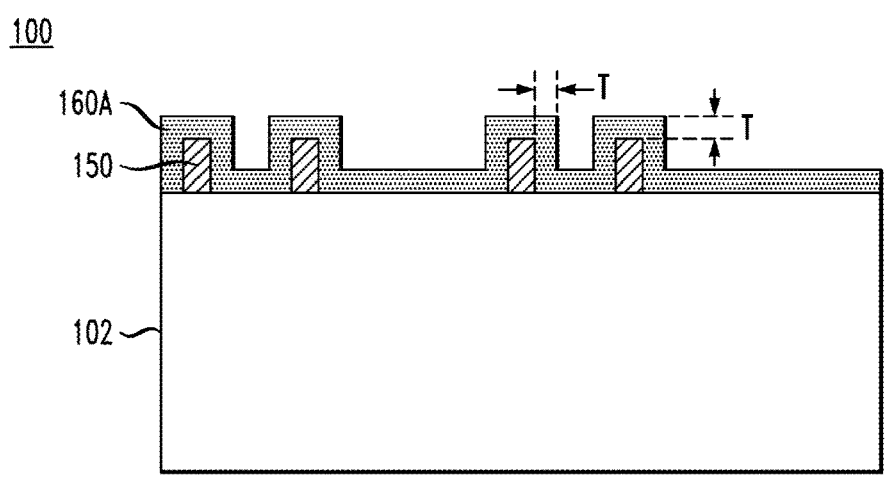
FIG. 1B is a schematic cross-sectional view of a portion of a semiconductor device at a second-intermediate fabrication stage, according to an embodiment of the invention.

A next phase of the fabrication process comprises forming a metal spacer layer 160A on the surface of the semiconductor structure to conformally cover the sacrificial mandrels 150 as schematically illustrated in FIG. 1B. In one embodiment of the invention, the conformal layer of metal spacer material 160A comprises a metallic material which is conformally deposited using known methods such as atomic layer deposition (ALD), chemical vapor deposition (CVD), physical vapor deposition (PVD), electroplating, or electroless plating. The layer of metal spacer material 160A can be formed of a metallic material such as cobalt, copper, ruthenium, titanium, tantalum, tungsten, manganese, aluminum, nickel, platinum, and titanium nitride. In one example embodiment of the invention, the conformal layer of spacer material 160A is formed with a thickness T in a range of about 10 nm to about 32 nm on the vertical and horizontal surface of the semiconductor structures.

Figure 1C:
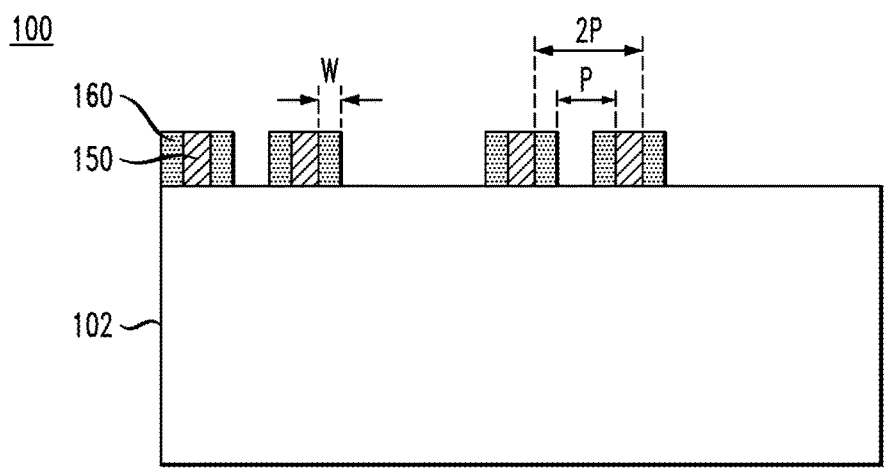
FIG. 1C is a schematic perspective view of a portion of a semiconductor device at a third-intermediate fabrication stage, according to an embodiment of the invention.

FIG. 1C schematically illustrates a next step in the process flow which comprises patterning the conformal layer of metal spacer material 160A to form metal spacers 160 on the vertical sidewalls of the sacrificial mandrels 150. FIG. 1C is a schematic cross-sectional side view of the semiconductor structure of FIG. 1B after performing a directional (anisotropic) etch process to etch away portions of the conformal layer of metal spacer material 160A on the horizontal surfaces of the sacrificial mandrels 150 and in the gaps between vertical portions of the conformal layer of spacer material 160A on the sidewalls of the sacrificial mandrels 150. The anisotropic etch process results in the formation of metal spacers 160 on the sidewalls of the sacrificial mandrels 150.

In one embodiment of the invention, the spacer etch process is performed using a directional dry etch process (anisotropic), such as RIE, having an etch chemistry which is suitable to etch the spacer material selective to the materials of the sacrificial mandrel 150 and the underlying hardmask layer 140. In some embodiments, during the directional etch process, there is minimal or no etching of the underlying hardmask layer 140 when the "aspect ratio" of the open spaces between the features is large enough to effectively serve as an etch mask to prevent etching of the exposed portions of the hard mask layer 140, as is understood by those of ordinary skill in the art. The etch process results in the formation of the spacers 160 having a minimum width W1 that is substantially the same as the thickness T of the conformal layer of metal spacer material 160A (see FIG. 1B).

Figure 1D:
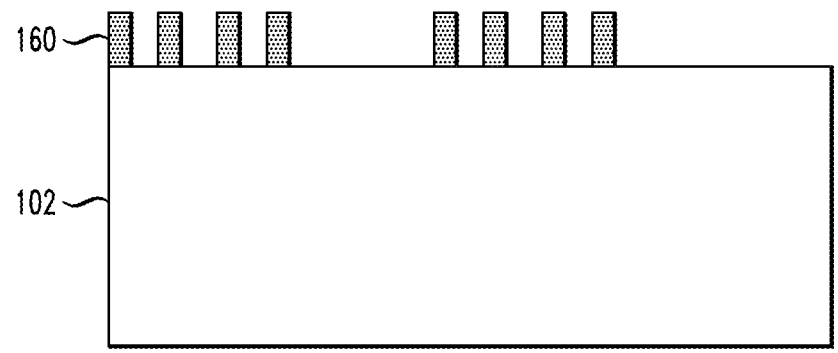
FIG. 1D is a schematic cross-sectional view of a portion of a semiconductor device at a fourth-intermediate fabrication stage, according to an embodiment of the invention.

Next, FIG. 1D is a cross-sectional view of the semiconductor structure shown in FIG. 1C after removing the sacrificial mandrels 150 while leaving the sidewall metal spacers 160 on the hardmask layer 140. The sacrificial mandrels 150 can be etched away selective to the spacers 160 using a RIE process with a suitable etch chemistry. In the resulting semiconductor structure shown in FIG. 1D, the metal spacers 160 provide a spacer pattern with pitch P and width T, and the metal spacers 160 are separated by gaps after removing the sacrificial mandrels 150.

As shown in FIG. 1D, the number of elongated metal spacers 160, i.e., metal lines, is essentially double the number of elongated sacrificial mandrels, and thus the pitch P of the spacer lines is half the pitch 2P of the sacrificial mandrel lines 150. This is due to the metal spacer material being deposited on each side of each sacrificial mandrel 150, which generates two elongated metal spacer features for every one sacrificial mandrel feature. This results in pitch splitting of the original sacrificial mandrel lines. The metal spacers 160 define the metallic material to form an array of interconnect wires.

Figure 1E:
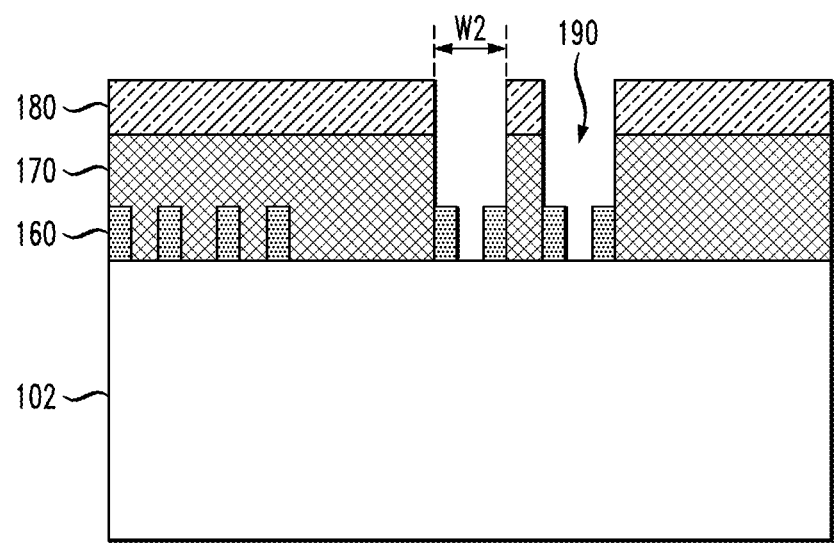
FIG. 1E is a schematic cross-sectional view of a portion of a semiconductor device at a fifth-intermediate fabrication stage, according to an embodiment of the invention.

FIG. 1E schematically illustrates a next step in the process flow which comprises forming a first insulator layer 170 and cut mask 180 and thereafter patterning the semiconductor structure to form openings 190. The first insulator layer 170 can be, for example, an OPL. The OPL can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL can include a transparent organic polymer. The first OPL may be deposited by, for example, a spin-on process followed by a bake.

Cut mask 180 is formed over OPL 170 with a pattern that defines "cuts" in the metal spacers 160, i.e., cuts in metal lines, as is known in the art. The cut mask 180 can be a photoresist mask that is formed using a standard photolithography process. The cut mask 180 is pattered to form two separate openings 190 to expose metal spacers 160 and then the cut mask 180 is removed (not shown). In the example embodiment of FIG. 1E, the cut mask 180 is patterned to form wide openings of width W2 in the OPL 170 and cut mask 180, which are wider than the minimum width W (see FIG. 1C). In this example embodiment, the width W2 is 3× the minimum width W. In this regard, it is to be appreciated that an opening in cut mask 180 can be formed in any desired pattern to define wide wires in any target region such as a width W2 is 5× the minimum width W1. Removal of cut mask 180 can be done by any process that removes material from the wafer. Examples include etch processes (either wet or dry), and chemical-mechanical planarization (CMP), and the like.

Figure 1F:
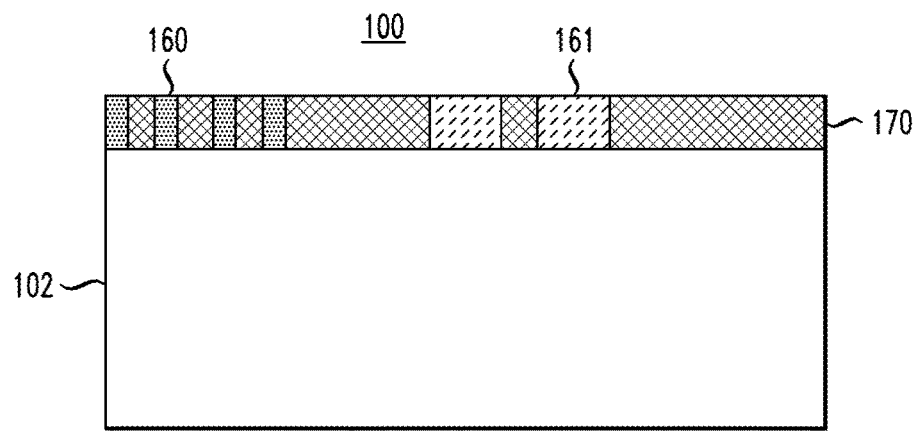
FIG. 1F is a schematic cross-sectional view of a portion of a semiconductor device at a sixth-intermediate fabrication stage, according to an embodiment of the invention.

FIG. 1F schematically illustrates a next step in the process flow which comprises depositing a metal material 161 into openings 190 and on the exterior surface of OPL 170. Metal material 161 will be deposited in the same manner as metal spacer 160 discussed above. Metal material 161 can be any of the metallic material discussed above for metal spacer 160. In one embodiment, the metal material 161 can be different from the metal material for metal spacer 160. In one embodiment, the metal material 161 can be the same as the metal material for metal spacer 160. Once metal material 161 is deposited, the top surface of the semiconductor structure is removed by dry or wet etch, and then is planarized by, for example, CMP, such that the top surface of metal spacers 160 and OPL 170 are coplanar. Accordingly, the pattern of elongated metal lines will include a plurality of metal lines 160 having a minimum width and at least one wider metal line 161 having the second width which is greater than the minimum width.

Figure 1G:
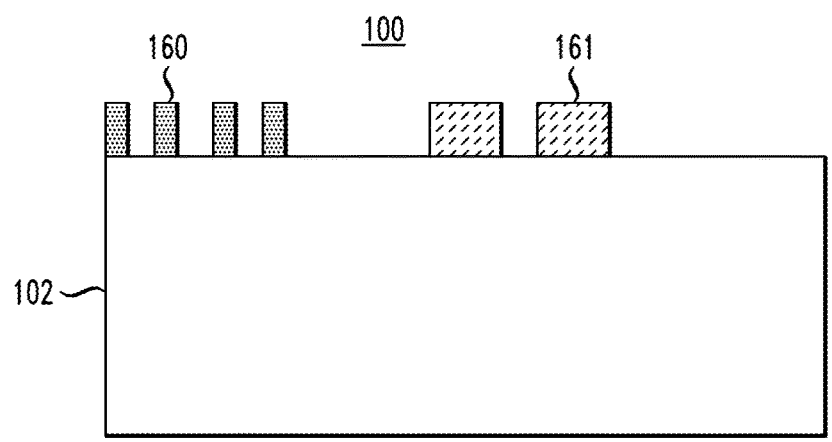
FIG. 1G is a schematic cross-sectional view of a portion of a semiconductor device at a seventh-intermediate fabrication stage, according to an embodiment of the invention.

FIG. 1G schematically illustrates a next step in the process flow which comprises removing OPL 170 from the semiconductor substrate using any known wet or dry etching technique. Following the removal of OPL 170, a cut lithography process is carried out as known in the art to cut the metal lines and define the final metal pattern (not shown). For example, another OPL layer can be deposited on the semiconductor structure and over the metal spacers 160. Next a lithography hardmask is deposited over the other OPL followed by a photoresist used to pattern the hardmask to etch away the OPL and cut the metal lines. Finally, the OPL, hardmask and photoresist are removed from the semiconductor structure.

Figure 1H:
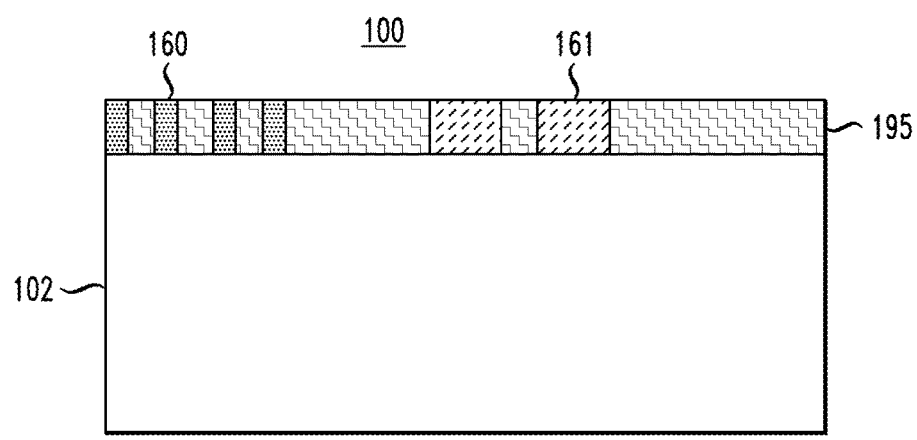
FIG. 1H is a schematic cross-sectional view of a portion of a semiconductor device at an eighth-intermediate fabrication stage, according to an embodiment of the invention.

FIG. 1H schematically illustrates a next step in the process flow which comprises depositing a dielectric layer 195 over the base 102 and plurality of metal lines 160 and at least one wider metal line 161 using a deposition process, such as chemical vapor deposition, plasma enhanced chemical vapor deposition (PECVD), metal organic chemical vapor deposition (MOCVD) or other like chemical vapor deposition processes. Dielectric layer 195 can be any suitable low-k dielectric material including, for example, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). After the dielectric layer 195 has been deposited, a CMP or etch back process is used to planarize the top surface of dielectric layer 195 to the top surface of the plurality of metal lines 160 having a minimum width and at least one wider metal line 161.

It is to be understood that the patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor device comprising:
   a back-end-of-line (BEOL) structure formed on a semiconductor substrate, wherein the BEOL structure comprises at least one metallization layer comprising a pattern of elongated parallel metal lines, wherein the pattern of elongated metal lines comprises a first set of adjacent metal lines having a uniform first width and a second set of adjacent metal lines having a uniform second width, wherein the uniform second width is greater than the uniform first width, and further wherein the first set of adjacent metal lines comprises a first metal material and the second set of adjacent metal lines comprises a second metal material different from the first metal material.

2. The semiconductor device of claim 1, wherein the uniform second width is at least 3× wider than the uniform first width.

3. The semiconductor device of claim 1, wherein the first set of adjacent metal lines and the second set of adjacent metal lines are independently selected from the group consisting of cobalt, copper, ruthenium, titanium, tantalum, tungsten, manganese, aluminum, nickel, platinum, and titanium nitride.

4. The semiconductor device of claim 1, wherein the BEOL structure further comprises an insulating layer coplanar with the first set of adjacent metal lines and the second set of adjacent metal lines.

5. The semiconductor device of claim 1, further comprising:
a front-end-of-line (FEOL)/middle-of-line (MOL) structure disposed on the semiconductor substrate.

6. The semiconductor device of claim 5, further comprising:
an insulating layer disposed on the FEOL/MOL structure; and
a hardmask layer disposed on the insulating layer.

7. The semiconductor device of claim 1, wherein the semiconductor substrate is a bulk semiconductor substrate.

8. The semiconductor device of claim 1, further comprising a dielectric layer disposed over the semiconductor substrate and the first set of adjacent metal lines and the second set of the plurality of adjacent metal lines.

9. The semiconductor device of claim 8, wherein the dielectric layer comprises a low-k dielectric material, a porous dielectric material or a ultra-low-k dielectric material.

10. The semiconductor device of claim 1, wherein the second set of adjacent metal lines comprises at least two metal lines.

11. An integrated circuit comprising:
a back-end-of-line (BEOL) structure formed on a semiconductor substrate, wherein the BEOL structure comprises at least one metallization layer comprising a pattern of elongated parallel metal lines, wherein the pattern of elongated metal lines comprises a first set of adjacent metal lines having a uniform first width and a second set of adjacent metal lines having a uniform second width, wherein the uniform second width is greater than the uniform first width, and further wherein the first set of adjacent metal lines comprises a first metal material and the second set of adjacent metal lines comprises a second metal material different from the first metal material.

12. The integrated circuit of claim 11, wherein the uniform second width is at least 3× wider than the uniform first width.

13. The integrated circuit of claim 11, wherein the first set of adjacent metal lines and the second set of adjacent metal lines are independently selected from the group consisting of cobalt, copper, ruthenium, titanium, tantalum, tungsten, manganese, aluminum, nickel, platinum, and titanium nitride.

14. The integrated circuit of claim 11, wherein the BEOL structure further comprises an insulating layer coplanar with the first set of adjacent metal lines and the second set of adjacent metal lines.

15. The integrated circuit of claim 11, further comprising:
a front-end-of-line (FEOL)/middle-of-line (MOL) structure disposed on the semiconductor substrate.

16. The integrated circuit of claim 15, further comprising:
an insulating layer disposed on the FEOL/MOL structure; and
a hardmask layer disposed on the insulating layer.

17. The integrated circuit of claim 11, wherein the semiconductor substrate is a bulk semiconductor substrate.

18. The integrated circuit of claim 11, further comprising a dielectric layer disposed over the semiconductor substrate and the first set of adjacent metal lines and the second set of adjacent metal lines.

19. The integrated circuit of claim 18, wherein the dielectric layer comprises a low-k dielectric material, a porous dielectric material or a ultra-low-k dielectric material.

20. The integrated circuit of claim 11, wherein the second set of adjacent metal lines comprises at least two metal lines.

* * * * *